(12) United States Patent
Liu et al.

(10) Patent No.: US 12,120,855 B2
(45) Date of Patent: Oct. 15, 2024

(54) COOLING APPARATUS AND DATA CENTER

(71) Applicant: Huawei Digital Power Technologies Co., Ltd., Shenzhen (CN)

(72) Inventors: Jihui Liu, Dongguan (CN); Jun Chen, Dongguan (CN)

(73) Assignee: Huawei Digital Power Technologies Co., Ltd., Shenzhen (CN)

( * ) Notice: Subject to any disclaimer, the term of this patent is extended or adjusted under 35 U.S.C. 154(b) by 233 days.

(21) Appl. No.: 17/964,120

(22) Filed: Oct. 12, 2022

(65) Prior Publication Data

US 2023/0115991 A1   Apr. 13, 2023

(30) Foreign Application Priority Data

Oct. 12, 2021 (CN) .......................... 202122457576.9

(51) Int. Cl.
*H05K 7/20* (2006.01)
(52) U.S. Cl.
CPC ................................ *H05K 7/20745* (2013.01)
(58) Field of Classification Search
CPC .................................................. H05K 7/20745
See application file for complete search history.

(56) References Cited

U.S. PATENT DOCUMENTS

| | | | | |
|---|---|---|---|---|
| 5,297,005 A * | 3/1994 | Gourdine | ........... | H05K 7/20154 361/695 |
| 6,940,716 B1 * | 9/2005 | Korinsky | ........... | G06F 1/20 361/679.48 |
| 7,212,403 B2 * | 5/2007 | Rockenfell | ........... | G06F 1/20 361/679.52 |
| 8,837,140 B2 * | 9/2014 | Zurowski | ........... | H05K 7/20154 361/691 |
| 9,298,229 B2 * | 3/2016 | Schelshorn | ........ | H05K 7/20145 |
| 9,402,332 B2 * | 7/2016 | McKervey | ........... | H05K 9/0041 |
| 9,696,064 B2 * | 7/2017 | Torii | ..................... | F25B 21/00 |
| 10,244,661 B2 * | 3/2019 | Scott | ................... | H05K 7/20145 |
| 11,153,992 B2 * | 10/2021 | Cader | .................. | H05K 7/1497 |
| 2007/0171613 A1 * | 7/2007 | McMahan | ........... | H05K 7/20736 361/695 |
| 2014/0293532 A1 * | 10/2014 | Schelshorn | ........ | H05K 7/20145 138/155 |

(Continued)

FOREIGN PATENT DOCUMENTS

CN            208804865 U        4/2019

*Primary Examiner* — Lisa Lea-Edmonds
(74) *Attorney, Agent, or Firm* — Maier & Maier, PLLC

(57) ABSTRACT

A cooling apparatus includes a housing, a cooling air duct, and an adsorption refrigeration unit. The housing includes a plurality of sidewalls, and the plurality of sidewalls form an inner cavity. The cooling air duct passes through the inner cavity. The adsorption refrigeration unit includes an adsorption bed, a flash evaporator, and an air cooler, the flash evaporator is connected to the air cooler, both the flash evaporator and the air cooler are disposed in the inner cavity, and the air cooler is located on a path of the cooling air duct. At least one of the plurality of sidewalls is a refrigeration sidewall, the refrigeration sidewall includes an internal wall plate and an external wall plate, the internal wall plate and the external wall plate are spaced apart and form sealed space, the sealed space is connected to the flash evaporator.

14 Claims, 14 Drawing Sheets

(56) References Cited

U.S. PATENT DOCUMENTS

| | | | | |
|---|---|---|---|---|
| 2017/0231118 A1* | 8/2017 | Cader | ................ | H05K 7/20354 |
| 2021/0368647 A1* | 11/2021 | Boucher | ............. | F28D 15/0266 |
| 2022/0240423 A1* | 7/2022 | Li | ......................... | F24F 12/006 |
| 2023/0115991 A1* | 4/2023 | Liu | .................... | H05K 7/20363 |
| | | | | 361/679.49 |

* cited by examiner

COOLING APPARATUS AND DATA CENTER

CROSS-REFERENCE TO RELATED APPLICATION

This application claims priority to Chinese Patent Application No. 202122457576.9, filed on Oct. 12, 2021, which is hereby incorporated by reference in its entirety.

TECHNICAL FIELD

The embodiments may relate to the field of heat dissipation technologies, a cooling apparatus, and a data center equipped with the cooling apparatus.

BACKGROUND

For an indoor scenario in which a heat source is disposed, especially an indoor scenario in which heat sources are disposed together, heat dissipation processing usually needs to be performed on an area in which the heat source is located. A data center is used as an example. A plurality of servers may be arranged in an equipment room of the data center. These servers generate a large amount of heat during running A refrigeration system of the data center is used to dissipate heat for and cool the data center, to ensure that the server in the data center can run normally in a preset temperature environment.

In an existing refrigeration system of the data center, a plurality of heat exchange manners such as air-cooling heat exchange, mechanical refrigeration heat exchange, and adsorption refrigeration heat exchange may be used. There is also a case in which some data centers work in two or more heat dissipation manners. When the refrigeration system of the data center includes an adsorption refrigeration heat exchange manner, because an adsorption bed needs to be used in adsorption refrigeration, and a volume of the adsorption bed is usually relatively large, a volume of the refrigeration system increases accordingly, and component arrangement inside the refrigeration system is also affected. In addition, a refrigeration system of an excessively large volume is not conducive to server arrangement in the data center.

SUMMARY

The embodiments may provide a compact cooling apparatus and a data center, to reduce an overall volume of the data center by implementing miniaturization of the cooling apparatus.

According to a first aspect, the embodiments may provide a cooling apparatus, including a housing, a cooling air duct, and an adsorption refrigeration unit. The housing includes a plurality of sidewalls. The plurality of sidewalls may form an inner cavity. The cooling air duct passes through the inner cavity. The adsorption refrigeration unit includes an adsorption bed, a flash evaporator, and an air cooler. The flash evaporator is connected to the air cooler, both the flash evaporator and the air cooler are disposed in the inner cavity, and the air cooler is located on a path of the cooling air duct. At least one of the plurality of sidewalls is a refrigeration sidewall, the refrigeration sidewall includes an internal wall plate and an external wall plate, and the internal wall plate and the external wall plate are spaced apart and form sealed space. The sealed space is connected to the flash evaporator. The adsorption bed is disposed in the sealed space.

In the cooling apparatus, the plurality of sidewalls may form the inner cavity, to accommodate the cooling air duct and the flash evaporator and the air cooler of the adsorption refrigeration unit. In the inner cavity of the housing, the air cooler is disposed on the path of the cooling air duct, so that the adsorption refrigeration unit can dissipate heat for air flowing in the cooling air duct. On the sidewall of the housing, the refrigeration sidewall including the internal wall plate and the external wall plate is disposed, so that the adsorption bed of the adsorption refrigeration unit may be accommodated in the sealed space. Therefore, the adsorption bed of the adsorption refrigeration unit does not occupy space of the inner cavity, and component arrangement inside the cooling apparatus is relatively free.

In addition, in a working process of the adsorption bed, air pressure in the sealed space is in a relatively low state. Therefore, the refrigeration sidewall can implement a better heat insulation effect and ensure a refrigeration effect in an inner cavity of the cooling apparatus. Compared with a conventional technology in which a relatively thick heat insulation component is disposed on a sidewall of a housing, the cooling apparatus can also implement a better heat insulation effect by using a working characteristic of the adsorption bed, without increasing thickness of the refrigeration sidewall, and a need of disposing a heat insulation component at a sidewall position is eliminated. Therefore, an overall volume of the cooling apparatus is also compressed, and this is conducive to miniaturization of the cooling apparatus.

In a possible implementation, the adsorption bed includes at least one heat dissipation fin, a heat dissipation cavity and a plurality of mesh holes penetrating the heat dissipation cavity are disposed on each heat dissipation fin, an adsorbent is accommodated in the heat dissipation cavity, the adsorbent is connected to the sealed space through the mesh holes, and the adsorbent is used to adsorb or desorb moisture in the sealed space.

In this implementation, the adsorbent is accommodated in a heat dissipator of the heat dissipation fin, and a connection between the adsorbent and the sealed space is ensured by using the plurality of mesh holes, to provide effects of positioning the adsorbent and adsorbing and desorbing the moisture in the sealed space.

In a possible implementation, the adsorption bed further includes a cyclic heating pipeline, and the cyclic heating pipeline passes through each heat dissipation fin, to heat the adsorbent.

In this implementation, the heating pipeline may be used to heat the adsorbent, to promote a desorption effect of the adsorbent.

In a possible implementation, the adsorption bed further includes a cyclic cooling pipeline, and the cyclic cooling pipeline passes through each heat dissipation fin, to cool the adsorbent.

In this implementation, heat is generated in an adsorption process of the adsorbent and the cyclic cooling pipeline may be used to cool the adsorbent.

In a possible implementation, the cyclic heating pipeline and the cyclic cooling pipeline are constructed as an integrated structure.

In this implementation, a temperature control unit that has both a refrigeration function and a heating function may be disposed in the cyclic heating pipeline, so that the cyclic heating pipeline further has a function of the cyclic cooling pipeline, to construct the cyclic heating pipeline and the cyclic cooling pipeline as an integrated structure. In this way, a quantity of components of the adsorption bed is reduced, and an overall volume of the adsorption bed is controlled.

In a possible implementation, all the heat dissipation fins are disposed in a direction perpendicular to the external wall plate, and the plurality of heat dissipation fins are sequentially arranged in a direction parallel to the external wall plate.

In this implementation, the heat dissipation fins are disposed in the direction perpendicular to the external wall plate and are arranged in the direction parallel to the external wall plate, so that a heat dissipation effect of each heat dissipation fin can be ensured, and a volume of each heat dissipation fin can be reduced.

In a possible implementation, a solenoid valve is disposed between the sealed space and the flash evaporator, and the solenoid valve is configured to establish or disconnect the connection between the sealed space and the flash evaporator.

In this implementation, when the solenoid valve is opened, the adsorption bed may act on the flash evaporator, and cool a refrigerant in the flash evaporator. When the solenoid valve is closed, a refrigeration function of the adsorption bed can be ensured.

In a possible implementation, all the plurality of sidewalls of the housing are constructed as refrigeration sidewalls.

In this implementation, all the plurality of sidewalls are constructed as refrigeration sidewalls, so that a refrigeration capability of the adsorption bed in the cooling apparatus is improved, and a relatively good heat insulation effect is achieved inside the cooling apparatus.

In a possible implementation, the cooling apparatus further includes an external air duct and a heat exchange unit. The external air duct passes through the inner cavity, and the external air duct further intersects the cooling air duct in the inner cavity. The heat exchange unit is disposed at an intersection of the external air duct and the cooling air duct, to implement heat exchange between the external air duct and the cooling air duct.

In this implementation, the external air duct and the heat exchange unit may perform air-cooling heat exchange on air in the cooling air duct, to improve a refrigeration effect of the cooling apparatus.

In a possible implementation, the cooling apparatus further includes a mechanical refrigeration unit, the mechanical refrigeration unit includes a condenser, and the condenser is also disposed on the path of the cooling air duct.

In this implementation, the mechanical refrigeration unit may perform air-cooling heat exchange on air in the cooling air duct, to improve a refrigeration effect of the cooling apparatus.

A data center provided in a second aspect includes an equipment room and the cooling apparatus provided in the first aspect. Opposite ends of a cooling air duct are separately connected to an inner side of the equipment room.

In the second aspect, because the cooling apparatus in the first aspect is used in the equipment room of the data center to dissipate heat, internal space of the data center is also improved, and server arrangement in the equipment room is facilitated. Further, based on expansion of the foregoing implementations, the data center can also implement a better heat dissipation effect.

DETAILED DESCRIPTION OF THE EMBODIMENTS

The following describes the embodiments with reference to the accompanying drawings. It is clear that the described embodiments are merely a part rather than all of the embodiments. All other embodiments obtained by a person of ordinary skill in the art based on the embodiments without creative efforts shall fall within the scope of the embodiments.

A cooling apparatus may be used in an indoor environment with a heat source and may be applicable to an indoor environment in which heat sources are arranged together, such as a data center. The data center is used as an example below for description.

Figure 1:
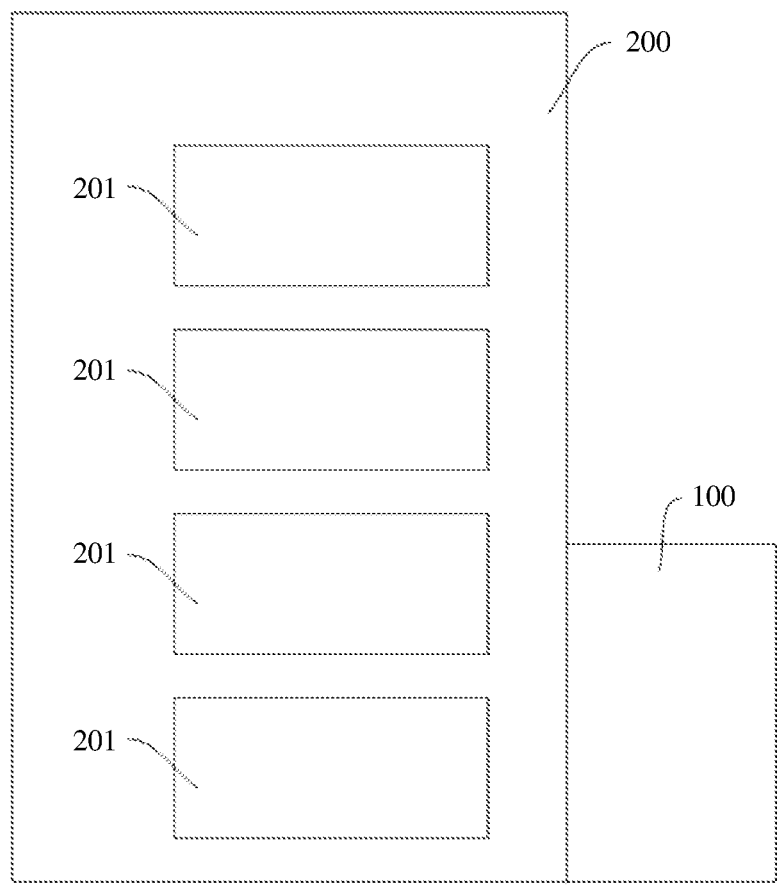
FIG. 1 is a schematic diagram of a scenario in which a cooling apparatus is used in a data center.

Refer to a schematic diagram, shown in FIG. 1, of a scenario in which a cooling apparatus 100 is used in a data center.

The data center includes an equipment room 200, and at least one IT device (for example, a server 201), a power supply apparatus, and/or the like are disposed in the equipment room 200. A large amount of heat is generated in a running process of the at least one IT device and/or the power supply apparatus. The cooling apparatus 100 may be configured to refrigerate and dissipate heat for the data center. In this embodiment, the data center may be a micro-module data center, may be a prefabricated data center, or may be a floor or a room that is formed by using a building and that is used to place an IT server. Based on the foregoing data centers in different forms, the cooling apparatus 100 may be disposed inside the equipment room 200 of the data center, may be disposed outside the equipment room 200, or may be partially located inside the equipment room 200 and partially located outside the equipment room 200.

In some implementation scenarios, in addition to the IT device and the power supply apparatus, a concept of the data center also includes a temperature control system and another accessory device. Therefore, the cooling apparatus 100 in this embodiment may also be considered as a part of the data center.

Figure 2:
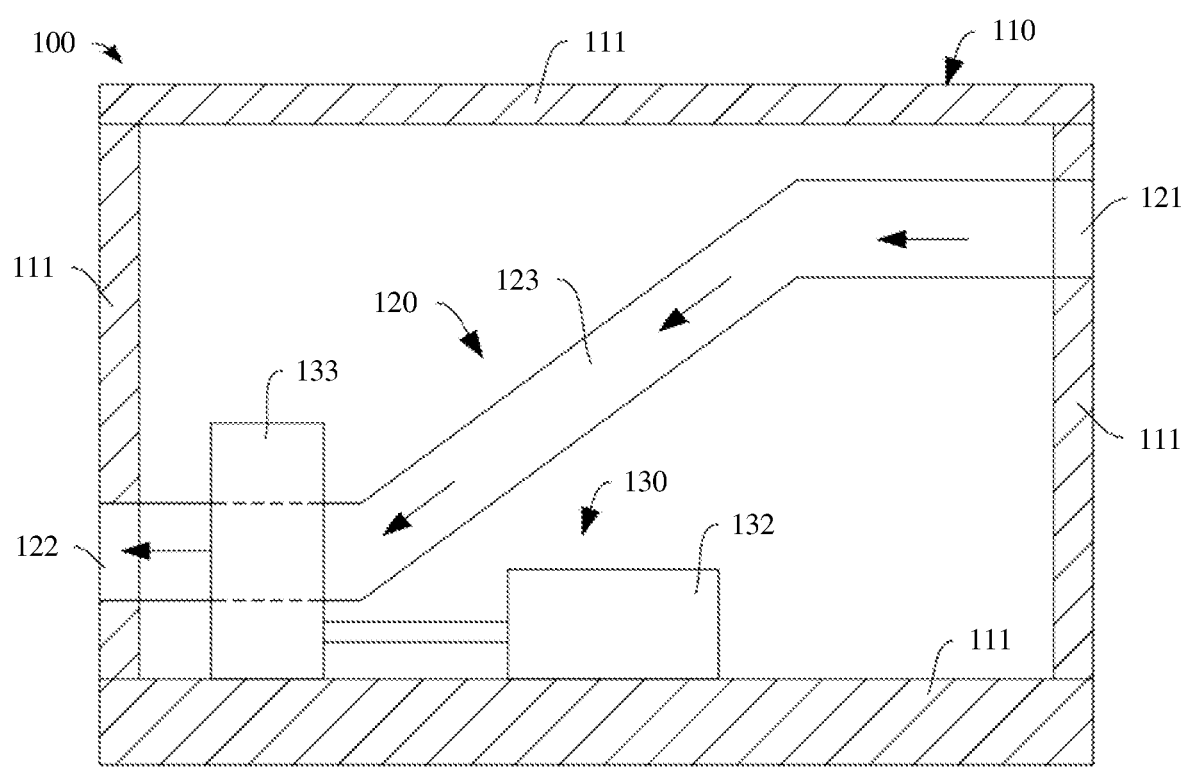
FIG. 2 is a schematic diagram of an internal structure of a cooling apparatus.

Refer to a schematic diagram, shown in FIG. 2, of a structure of the cooling apparatus 100.

Figure 3:
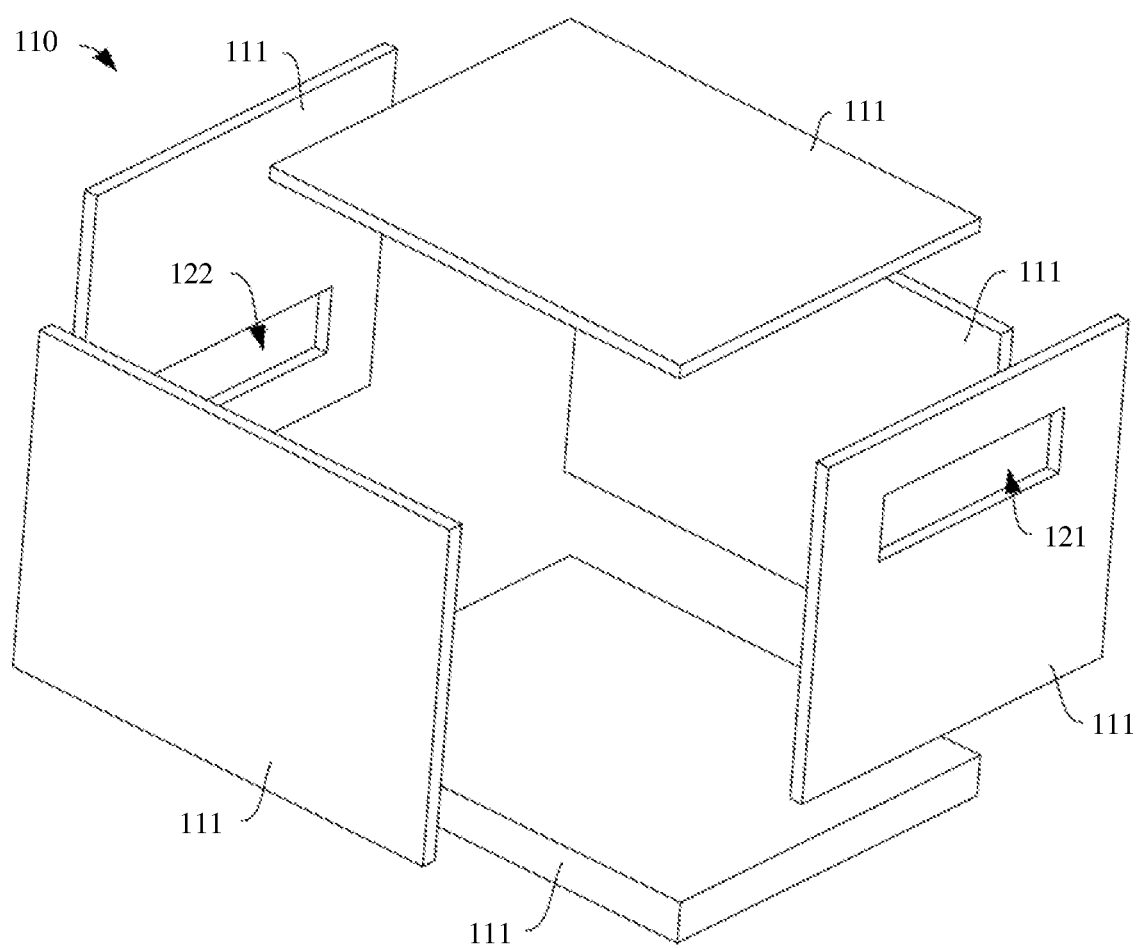
FIG. 3 is a schematic diagram of a structure of a housing in a cooling apparatus.

The cooling apparatus 100 includes a housing 110, a cooling air duct 120, and an adsorption refrigeration unit 130. As shown in FIG. 3, the housing 110 includes a plurality of sidewalls 111. The plurality of sidewalls 111 form an inner cavity of the housing 110. In this embodiment, the cooling apparatus 100 is approximately a cuboid. Therefore, six sidewalls 111 form the housing 110. The cooling air duct 120 includes an air intake vent 121, an air return vent 122, and an air duct 123 connected between the air intake vent 121 and the air return vent 122. The air intake vent 121 is disposed on one sidewall 111, and the air return vent 122 is also disposed on one sidewall 111. The air intake vent 121 and the air return vent 122 are separately connected to the equipment room 200, and the air duct 123 is accommodated in the inner cavity of the housing 110. Therefore, the cooling air duct 120 passes through the inner cavity of the housing 110. Air in the equipment room 200 may enter the inner cavity of the housing 110 from the air intake vent 121, and then flow out of the air return vent 122 after flowing through the air duct 123.

In the schematic diagram of FIG. 2, the air intake vent 121 and the air return vent 122 are separately disposed on two opposite sidewalls 111 of the housing 110. In other embodiments, the air intake vent 121 and the air return vent 122 may alternatively be disposed on two adjacent sidewalls 111 of the housing 110. In addition, in some embodiments, the air intake vent 121 and the air return vent 122 may alternatively be disposed on a same sidewall 111 of the housing 110. All these manners do not affect a path along which the air in the equipment room 200 flows through the inner cavity of the housing 110.

Figure 4:
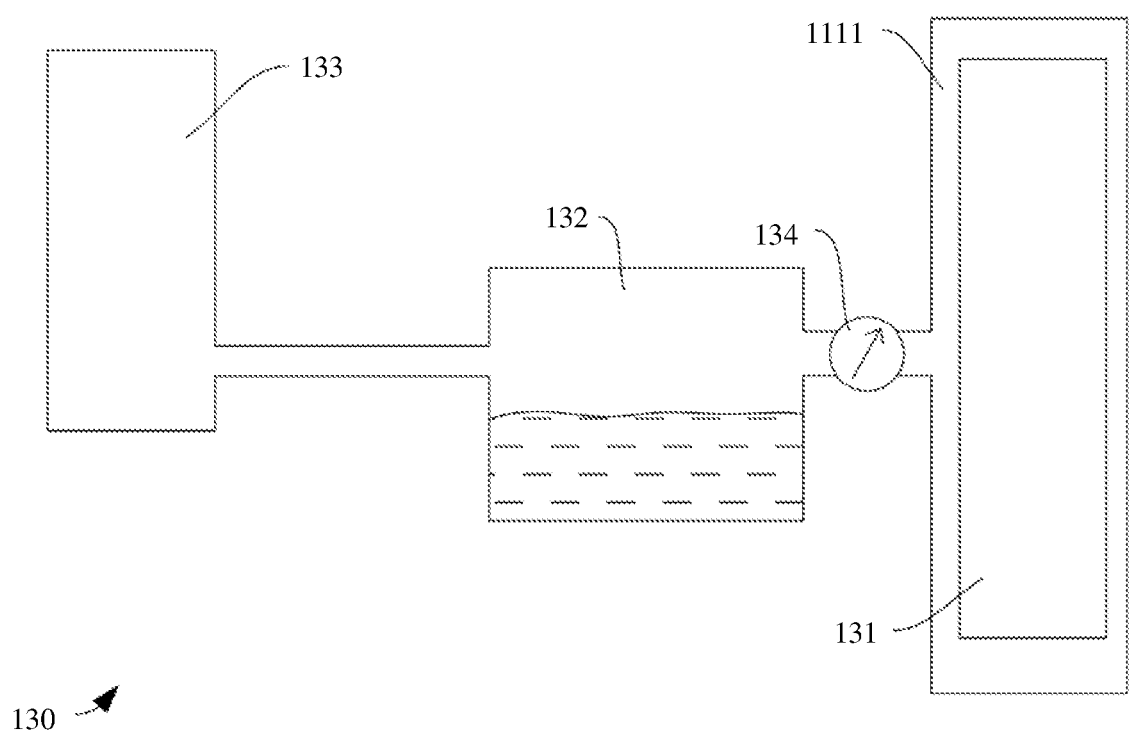
FIG. 4 is a schematic diagram of a structure of an adsorption refrigeration unit in a cooling apparatus.

As shown in FIG. 4, the adsorption refrigeration unit 130 may include an adsorption bed 131, a flash evaporator 132, and an air cooler 133. The flash evaporator 132 is connected to the air cooler 133. A refrigerant is stored in the flash evaporator 132, and the refrigerant may be water, a refrigerating medium, or the like. In this embodiment, water is used as an example of the refrigerant for description. The flash evaporator 132 and the air cooler 133 are connected to each other and both are located in the inner cavity of the housing 110. Further, the air cooler 133 is further disposed on a path of the air duct 123; in other words, the air cooler 133 is disposed on a flowing path of the cooling air duct 120. Water is circulated between the air cooler 133 and the flash evaporator 132 that are connected to each other. Temperature of water in the flash evaporator 132 is relatively low, and when the water flows into the air cooler 133, the water may exchange heat with air in the air duct 123, so that after air with relatively high temperature that flows into the equipment room 200 from the air intake vent 121 exchanges heat with water with relatively low temperature in the air cooler 133, air with relatively low temperature is formed, and then the air flows back to the equipment room 200 from the air return vent 122. In this way, an effect of cooling and refrigerating the equipment room 200 is achieved.

Figure 5:
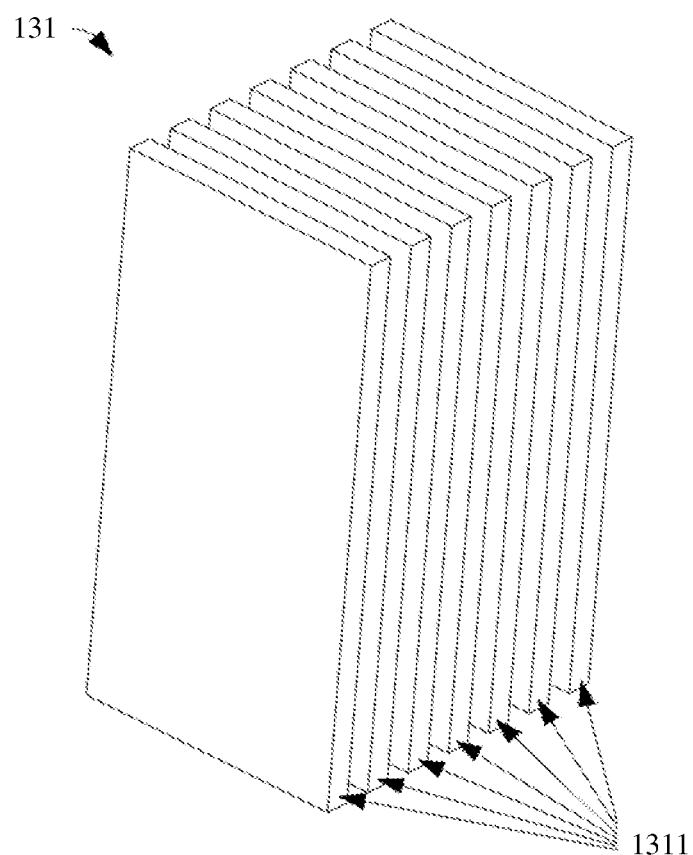
FIG. 5 is a schematic diagram of a structure of an adsorption bed in a cooling apparatus.
Figure 6:
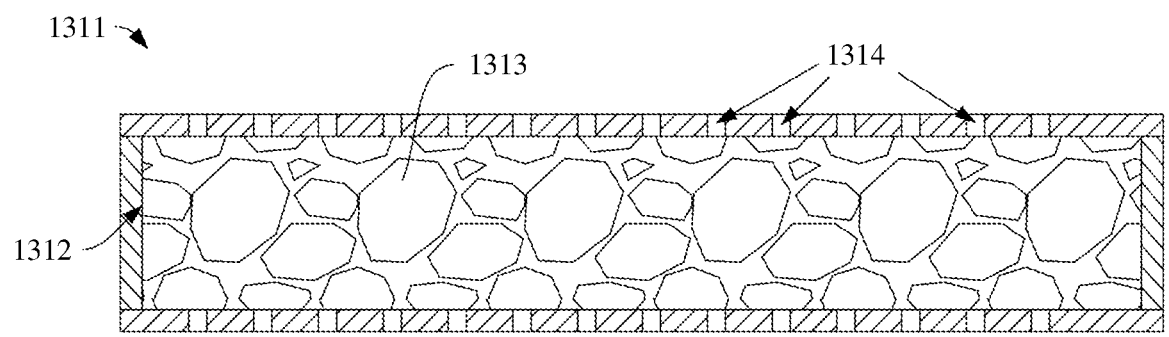
FIG. 6 is a schematic diagram of a cross-section structure of a heat dissipation fin on an adsorption bed in a cooling apparatus.

In a schematic diagram of FIG. 4, the adsorption bed 131 needs to be disposed in sealed space, and the sealed space needs to be synchronously connected to the flash evaporator 132. As shown in FIG. 5 and FIG. 6, the adsorption bed 131 may include a plurality of heat dissipation fins 1311. A heat dissipation cavity 1312 is disposed in each heat dissipation fin 1311, and an adsorbent 1313 is accommodated in each heat dissipation cavity 1312. Further, a plurality of mesh holes 1314 are further disposed on each heat dissipation fin 1311, and the plurality of mesh holes 1314 are used to connect the heat dissipation cavity 1312 and the outside of the heat dissipation fin 1311. In other words, the adsorbent 1313 accommodated in the heat dissipation cavity 1312 may communicate with air in the sealed space by using each mesh hole 1314.

The adsorbent 1313 has functions of performing desorption when being heated and performing adsorption when being cooled. When the adsorption bed 131 is disposed in the sealed space, when temperature in daytime is relatively high, or when the adsorption bed 131 is heated, the adsorbent 1313 performs desorption after being heated, vapor is desorbed into the sealed space, and the desorbed vapor is condensed into water, and the water is guided to and collected inside the flash evaporator 132 connected to the sealed space; and when temperature at night is reduced or when the adsorption bed 131 is cooled, the adsorbent 1313 starts perform adsorption when being cooled, and the water in the sealed space may be adsorbed inside the heat dissipation cavity 1312. In this case, pressure in the sealed space decreases, and in some embodiments, adsorption of the adsorbent 1313 further enables the sealed space to be in an approximately vacuum state. Correspondingly, pressure in the flash evaporator 132 connected to the sealed space decreases accordingly.

Figure 7:
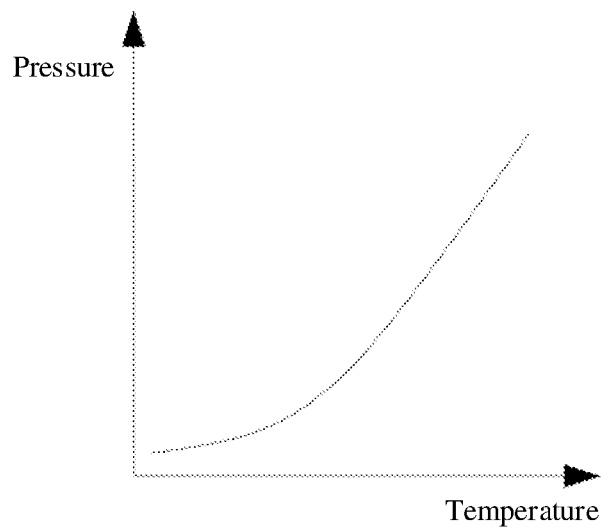
FIG. 7 is a schematic diagram of temperature change of water used as a refrigerant in a cooling apparatus in ambient pressure.

As shown in FIG. 7, a water temperature may be proportional to pressure in an environment in which the water is located. In other words, for the flash evaporator 132 storing refrigerant water, higher internal pressure of the flash evaporator 132 leads to higher temperature of the water stored in the flash evaporator 132, and lower internal pressure of the flash evaporator 132 leads to lower temperature of the water stored in the flash evaporator 132. Therefore, the cooling apparatus 100 may adjust the pressure in the flash evaporator 132 by using the adsorbent 1313, to achieve an effect of adjusting temperature of the refrigerant (water). The adsorbent 1313 is controlled to be in an adsorption state, and the pressure in the flash evaporator 132 is reduced, so that the refrigerant water in the adsorption refrigeration unit 130 is always in a relatively low temperature state. Therefore, it is ensured that after the air cooler 133 exchanges heat with the air in the cooling air duct 120, temperature of the air in the cooling air duct 120 can be reduced, and an effect of cooling and refrigerating the air in the equipment room 200 can be achieved.

Figure 8:
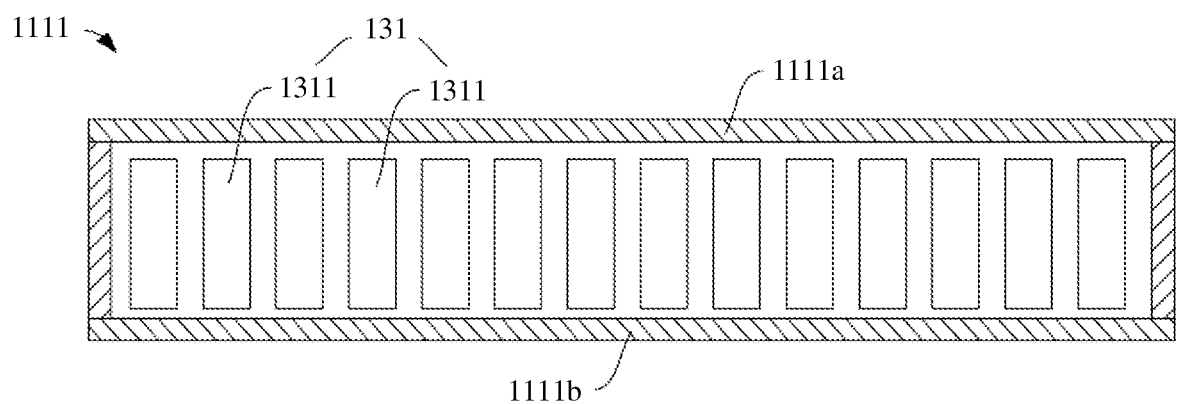
FIG. 8 is a schematic diagram of a cross-section structure of a refrigeration sidewall of a housing in a cooling apparatus.

As shown in an embodiment shown in FIG. 8, for the cooling apparatus 100, at least one of the plurality of sidewalls 111 of the housing 110 in the cooling apparatus 100 may be a refrigeration sidewall 1111. The refrigeration sidewall 1111 includes an internal wall plate 1111a and an external wall plate 1111b that are opposite to each other. The internal wall plate 1111a and the external wall plate 1111b are spaced apart, and sealed space is formed between the two wall plates. The adsorption bed 131 of the adsorption refrigeration unit 130 is disposed in the sealed space between the internal wall plate 1111a and the external wall plate 1111b. In other words, in the cooling apparatus 100, a structure of the sealed space is formed between an internal wall plate 1111a and an external wall plate 1111b of one or more sidewalls 111, to accommodate the adsorption bed 131 of the adsorption refrigeration unit 130. Therefore, the adsorption bed 131 is disposed inside the one or more sidewalls 111 of the housing 110 and does not occupy space of the inner cavity of the housing 110.

In an adsorption refrigeration apparatus in a conventional technology, an adsorption bed 131 usually needs to be disposed in an inner cavity of a housing 110, and to ensure a pressure reduction effect of the adsorption bed 131 on a refrigerant in a flash evaporator 132, a volume of an adsorbent 1313 that needs to be carried by the adsorption bed 131 is relatively large, and consequently, an overall volume of the adsorption bed 131 is increased, and occupation of space of the inner cavity of the housing 110 is also increased accordingly. Such a structure affects space arrangement of the inner cavity of the housing 110 and is not conducive to miniaturization of the cooling apparatus 100. It may be understood that a cooling apparatus 100 with a relatively large volume also occupies internal space of an equipment room 200 of a data center, and consequently, arrangement or a quantity of servers 201 in the equipment room 200 is limited. Alternatively, disposing the cooling apparatus 100 outside the equipment room 200 is not conducive to arrangement of the cooling apparatus 100.

Further, to ensure a cooling effect of the cooling apparatus 100, a heat insulation component is usually disposed on the sidewall 111 of the housing 110, to avoid direct transmission of external high temperature to an inner side of the housing 110. Thickness of the heat insulation component is usually relatively thick, and consequently, an overall volume of the sidewall 111 is relatively large. In the cooling apparatus 100, a structure of the refrigeration sidewall 1111 is disposed, and the adsorption bed 131 accommodated on the refrigeration sidewall 1111 can reduce pressure in the sealed space, so that an inner side of the refrigeration sidewall 1111 is in an approximately vacuum state. Therefore, the refrigeration sidewall 1111 forms a relatively good heat insulation effect; in other words, due to disposing of the refrigeration sidewall 1111, a structure of the heat insulation component can be omitted, so that accommodation of the adsorption bed 131 on the refrigeration sidewall 1111 does not have relatively large impact on a volume of the refrigeration sidewall 1111, and an overall volume of the cooling apparatus 100 is not increased due to the structure of the refrigeration sidewall 1111.

Therefore, the cooling apparatus 100 is disposed in the foregoing structure, so that the cooling apparatus 100 refrigerates the air in the equipment room 200 through heat exchange, and also reduces a space volume of the inner cavity of the housing 110, and this helps control the overall volume of the cooling apparatus 100. Further, the refrigeration sidewall 1111 further implements a heat insulation effect, to ensure internal temperature of the cooling apparatus 100 and achieve a better refrigeration effect. Compared with the conventional technology in which a structure of adsorption refrigeration heat exchange is used, the cooling apparatus 100 has a smaller volume, and a refrigeration effect is also ensured.

It may be understood that in this embodiment, the sidewalls 111 may include only one refrigeration sidewall 1111, or may include a plurality of refrigeration sidewalls 1111, to accommodate an adsorption bed 131 of a larger volume and use more adsorbents 1313 to ensure a heat exchange effect of the cooling apparatus 100. In some embodiments, the housing 110 may alternatively be a structure in which only the refrigeration sidewall 1111 is used; in other words, each sidewall 111 of the housing 110 is disposed as the refrigeration sidewall 1111. In this way, the volume of the adsorption bed 131 is maximized, and a better refrigeration effect and a better heat exchange effect are achieved.

It may be understood that a heat insulation component may also be disposed on the refrigeration sidewall 1111, to further improve a heat insulation effect of the refrigeration sidewall 1111. Because the refrigeration sidewall 1111 has a relatively strong heat insulation capability, thickness of the heat insulation component disposed on the refrigeration sidewall 1111 may be relatively thin, and an effect of partially reducing the overall volume of the cooling apparatus 100 is also achieved.

In the embodiment of FIG. 4, a solenoid valve 134 is further disposed between the refrigeration sidewall 1111 and the flash evaporator 132. The solenoid valve 134 is configured to establish or disconnect a connection between the sealed space of the refrigeration sidewall 1111 and the flash evaporator 132, so that the sealed space of the refrigeration sidewall 1111 and the flash evaporator 132 form a connected state or form a state of mutually independent space. It may be understood that when the solenoid valve 134 is opened, the adsorption bed 131 is connected to the flash evaporator 132. In this case, the adsorbent 1313 may perform desorption or adsorption. After the adsorbent 1313 reaches a preset desorption state, the solenoid valve 134 is closed. In this case, the adsorption bed 131 is in a refrigeration state, and does not cool the refrigerant in the flash evaporator 132. When a refrigeration function needs to be provided for the flash evaporator 132, the solenoid valve 134 is opened, and the adsorbent 1313 enters an adsorption state, and then the refrigerant is cooled.

Figure 9:
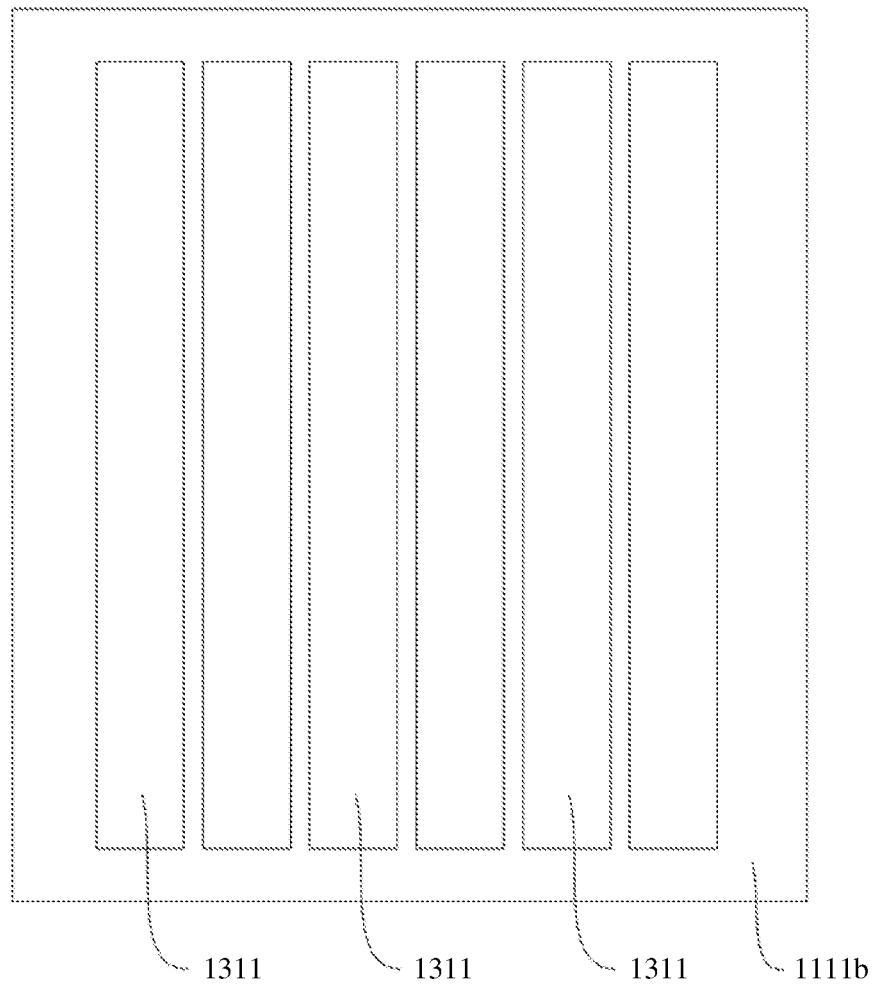
FIG. 9 is a schematic diagram of an internal structure of a refrigeration sidewall of a housing in a cooling apparatus.

As shown in FIG. 9, an arrangement direction of the plurality of heat dissipation fins 1311 on the adsorption bed 131 may be parallel to a plane direction of the external wall plate 1111b. In addition, the external wall plate 1111b is usually parallel to the internal wall plate 1111a. Therefore, the arrangement direction of the plurality of heat dissipation fins 1311 is also parallel to a plane direction of the internal wall plate 1111a. Further, a disposing direction of each heat dissipation fin 1311 may be further perpendicular to a direction of the external wall plate 1111b; in other words, the plurality of heat dissipation fins 1311 are separately disposed perpendicular to the external wall plate 1111b, and the plurality of heat dissipation fins 1311 are further arranged in the direction parallel to the external wall plate 1111b. Such disposing can increase arrangement density of the heat dissipation fins 1311 on the adsorption bed 131, ensure a heat dissipation effect of each heat dissipation fin 1311, and reduce a volume of a single heat dissipation fin 1311. For the refrigeration sidewall 1111, the heat dissipation fins 1311 are arranged in the plane direction of the external wall plate 1111b and the internal wall plate 1111a, so that overall thickness of the refrigeration sidewall 1111 can be further reduced, and this helps control the overall volume of the cooling apparatus 100.

Figure 10:
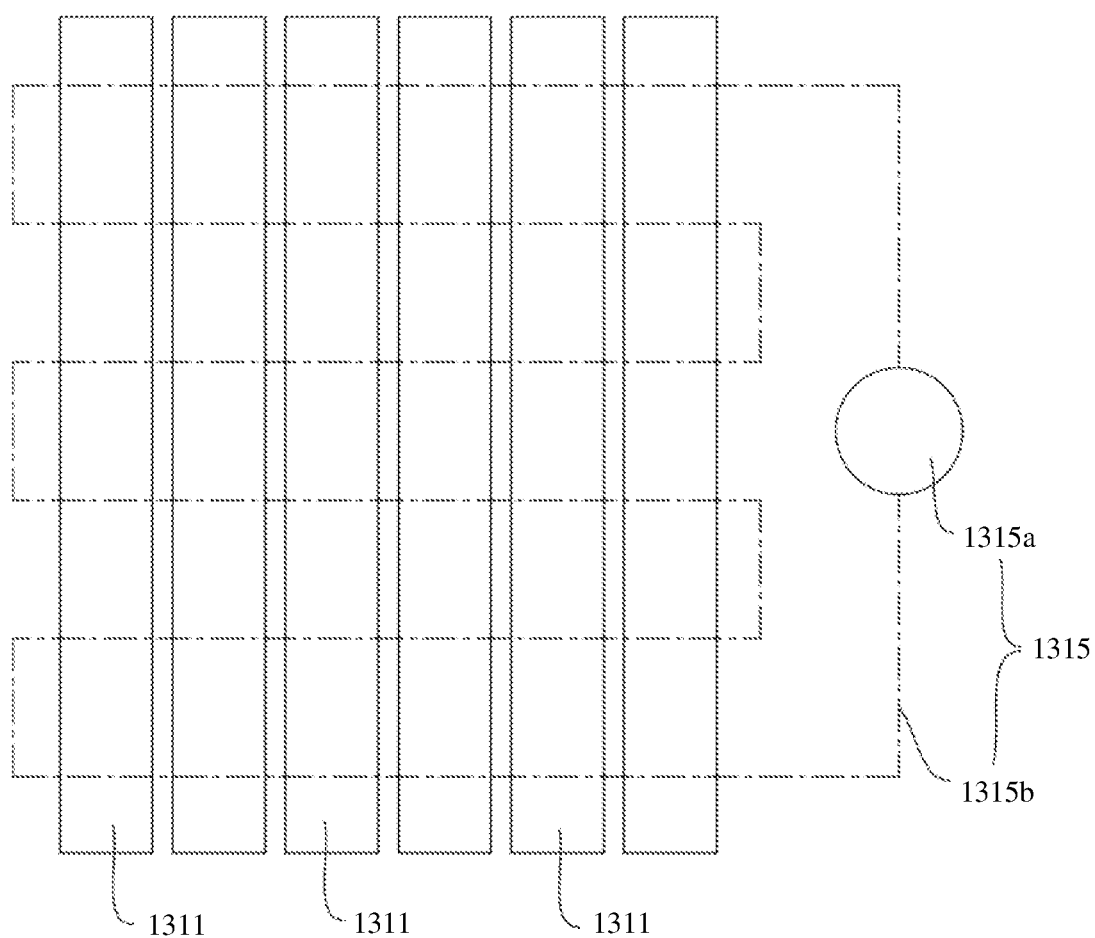
FIG. 10 is a schematic diagram of a structure of an adsorption bed in a cooling apparatus.

FIG. 10 shows a structure of the adsorption bed 131 on the refrigeration sidewall 1111. In this embodiment, the adsorption bed 131 further includes a cyclic heating pipeline 1315. The cyclic heating pipeline 1315 includes a heat source 1315a and a heating pipe 1315b. The heating pipe 1315b sequentially passes through the arranged heat dissipation fins 1311, and a head end and a tail end of the heating pipe 1315b are separately connected to the heat source 1315a. A heating medium, such as water, is circulated in the cyclic heating pipeline 1315. The heat source 1315a is used to continuously heat the heating medium and drive the heated heating medium to sequentially flow through the heat dissipation fins 1311 along a path of the heating pipe 1315b, to heat each heat dissipation fin 1311.

As mentioned above, the adsorbent 1313 in the heat dissipation fin 1311 has functions of performing desorption at high temperature and performing adsorption at low temperature. Temperature of the adsorbent 1313 can be actively controlled by disposing the cyclic heating pipeline 1315. It may be understood that when the heating medium flows into the heating pipe 1315b from the heat source 1315a, temperature of the heating medium is relatively high, so that temperature of the adsorbent 1313 in each heat dissipation fin 1311 can be increased, and a desorption degree of the adsorbent 1313 is promoted. After the heating medium sequentially flows through the heat dissipation fins 1311 and flows back to the heat source 1315a from the heating pipe 1315b, temperature of the heating medium decreases in a process of exchanging heat with the adsorbent 1313, and the heat source 1315a can heat the heating medium again, so that the heating medium is circulated in the cyclic heating pipeline 1315, and the temperature of the adsorbent 1313 is continuously increased, to ensure a desorption degree of the adsorption bed 131.

In a schematic diagram of FIG. 10, a circulation path of the heating pipe 1315b is set, so that the heating pipe 1315b passes through the arranged heat dissipation fins 1311 for a plurality of times; in other words, for a single heat dissipation fin 1311, the heating pipe 1315b passes through the heat dissipation fin 1311 for a plurality of times. In this way, a contact area between the heating medium and the adsorbent 1313 in the heating pipe 1315b may be increased, so that areas in which the heating pipe 1315b dissipates heat for a single heat dissipation fin 1311 are distributed more evenly. Therefore, consistency of desorption states of the adsorbents 1313 is improved, and this helps improve a desorption effect of the adsorption bed 131.

It should be noted that, because the heating pipe 1315b in the cyclic heating pipeline 1315 passes through the heat dissipation fins 1311, at least a majority of heating pipes 1315b are also accommodated in the refrigeration sidewall 1111 together with the adsorption bed 131. A position of the heat source 1315a may be accommodated in the refrigeration sidewall 1111 or may be disposed in the inner cavity of the housing 110. Because a volume of the heat source 1315a is relatively small, when the heat source 1315a is accommodated in the inner cavity of the housing 110, relatively small impact is exerted on arrangement of internal components of the cooling apparatus 100, and the overall volume of the cooling apparatus 100 can also be controlled.

Figure 11:
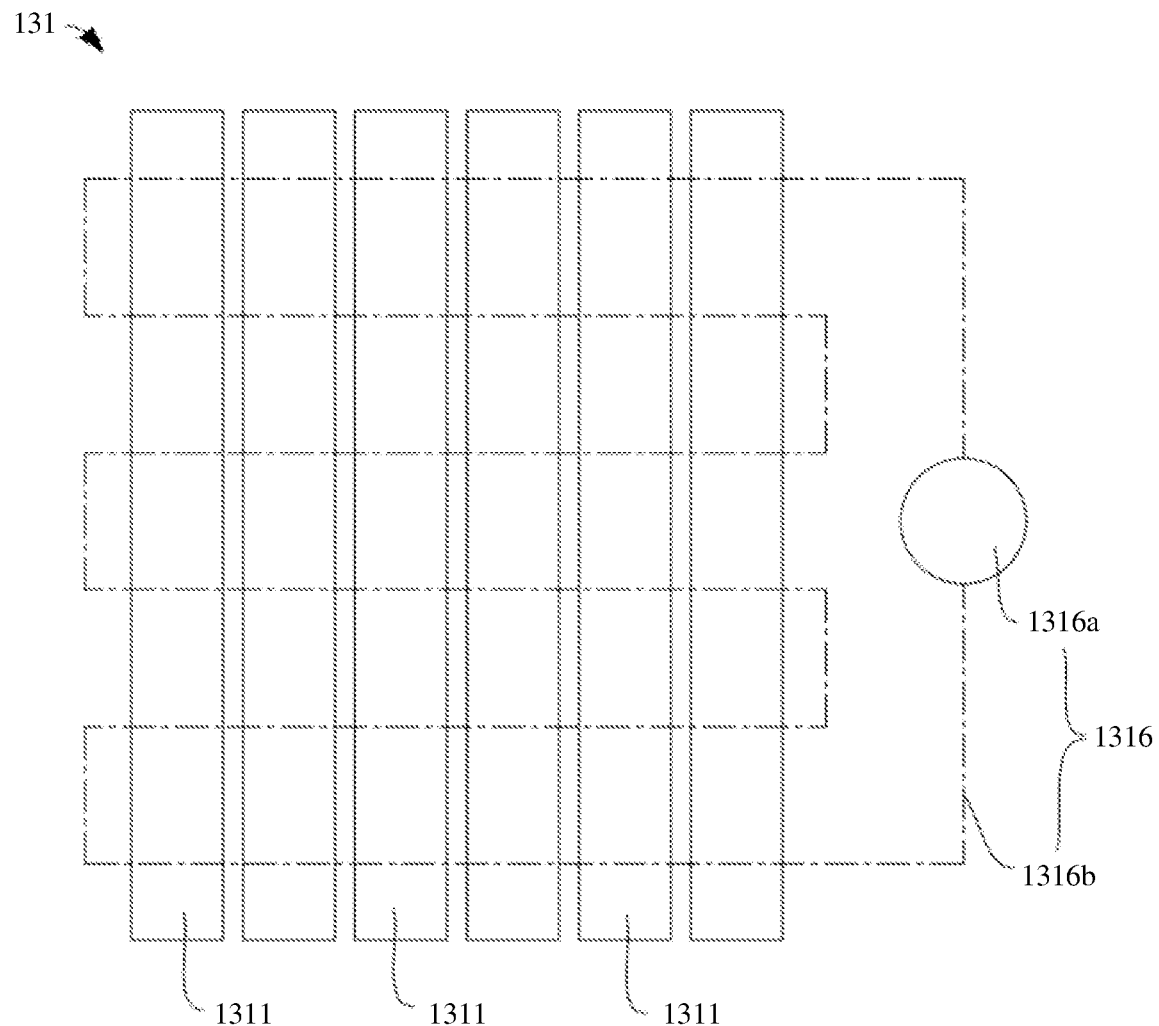
FIG. 11 is a schematic diagram of a structure of an adsorption bed in another cooling apparatus.

In a schematic diagram of FIG. 11, the adsorption bed 131 may further include a cyclic cooling pipeline 1316. The cyclic cooling pipeline 1316 includes a cold source 1316a and a cooling pipe 1316b. The cooling pipe 1316b also sequentially passes through the arranged heat dissipation fins 1311, and a head end and a tail end of the cooling pipe 1316b are separately connected to the cold source 1316a. A refrigerant, such as water, is circulated in the cyclic cooling pipeline 1316. The cold source 1316a is used to continuously cool the refrigerant and drive the cooled refrigerant to sequentially flow through the heat dissipation fins 1311 along a path of the cooling pipe 1316b, to cool each heat dissipation fin 1311.

When the adsorbent 1313 enters an adsorption state from a desorption state, vapor flows into the adsorption bed 131 and is adsorbed by the adsorbent 1313 and releases a large amount of adsorption heat. Temperature of the adsorption heat can reach 60° C. to 80° C. In this way, temperature of the sealed space in the refrigeration sidewall 1111 increases, and a refrigeration effect on the refrigerant decreases. In this embodiment, the cyclic cooling pipeline 1316 is introduced, so that the adsorption bed 131 may be cooled at an adsorption stage of the adsorbent 1313, to ensure that the adsorbent 1313 is in a low temperature state and ensure consistency of the temperature of the adsorbents 1313, so that a better adsorption effect is achieved.

It may be understood that, in a schematic diagram of FIG. 11, a path of the cooling pipe 1316b is set, so that the cooling pipe 1316b passes through the arranged heat dissipation fins 1311 for a plurality of times; in other words, for a single heat dissipation fin 1311, the cooling pipe 1316b passes through the heat dissipation fin 1311 for a plurality of times. In this way, a contact area between the cooling medium and the adsorbent 1313 in the cooling pipe 1316b may be increased, so that areas in which the cooling pipe 1316b cools a single heat dissipation fin 1311 are distributed more evenly. Therefore, consistency of desorption states of the adsorbents 1313 is improved, and this helps improve an adsorption effect of the adsorption bed 131.

In addition, because the cooling pipe 1316b in the cyclic cooling pipeline 1316 passes through the heat dissipation fins 1311, at least a majority of cooling pipes 1316b are also accommodated in the refrigeration sidewall 1111 together with the adsorption bed 131. A position of the cold source 1316a may be accommodated in the refrigeration sidewall 1111 or may be disposed in the inner cavity of the housing 110. Because a volume of the cold source 1316a is relatively small, when the cold source 1316a is accommodated in the inner cavity of the housing 110, relatively small impact is exerted on arrangement of internal components of the cooling apparatus 100, and the overall volume of the cooling apparatus 100 can also be controlled.

Figure 12:
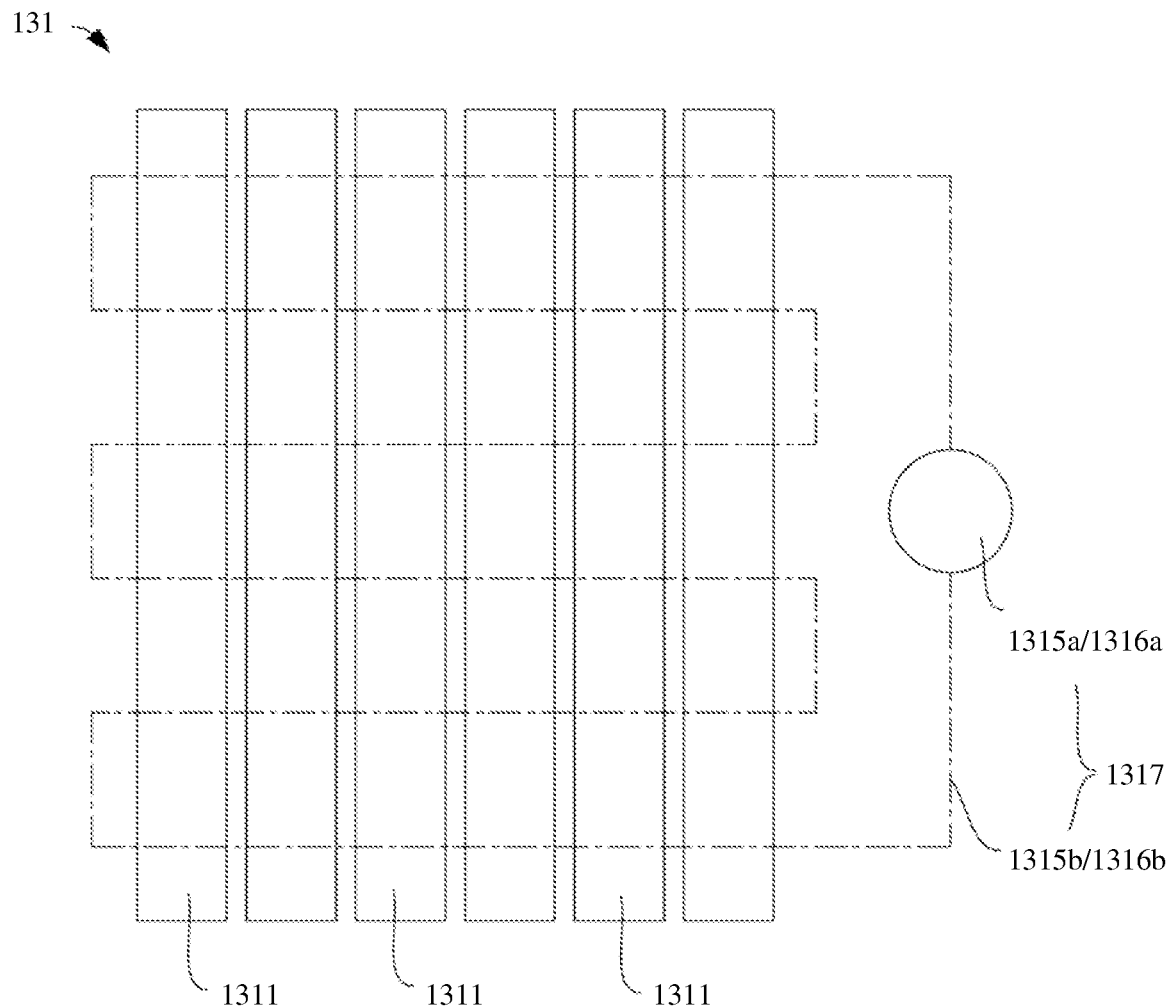
FIG. 12 is a schematic diagram of a structure of an adsorption bed in still another cooling apparatus.

In a schematic diagram of FIG. 12, the cyclic heating pipeline 1315 and the cyclic cooling pipeline 1316 are constructed as an integrated structure 1317. In other words, the heating pipe 1315b in the cyclic heating pipeline 1315 is also used as the cooling pipe 1316b in the cyclic cooling pipeline 1316. The heat source 1315a in the cyclic heating pipeline 1315 has a cooling function and can be used as the cold source 1316a in the cyclic cooling pipeline 1316. Alternatively, in some embodiments, the heat source 1315a and the cold source 1316a may be disposed separately, and the heat source 1315a and the cold source 1316a are connected in series or in parallel to the heating pipe 1315b or the cooling pipe 1316b and are respectively used to heat the heating medium and cool the refrigerant.

The cyclic heating pipeline 1315 and the cyclic cooling pipeline 1316 have different working phases. The cyclic heating pipeline 1315 may be configured to heat the adsorbent 1313 when the adsorbent 1313 is in the desorption state, to promote a desorption effect; and the cyclic cooling pipeline 1316 may be configured to cool the adsorbent 1313 when the adsorbent 1313 is in the adsorption state, to promote an adsorption effect. Therefore, the cyclic heating pipeline 1315 and the cyclic cooling pipeline 1316 are disposed as an integrated structure, and are switched based on a working mode of the heat source 1315a and a working mode of the cold source 1316a, or are switched based on temperature that is of the heating medium or the refrigerant and that can be controlled when the heating medium or the refrigerant flows through the heat source 1315a or the cold source 1316a at different stages, and further, a heating or cooling effect is provided for the adsorbent 1313 at different working stages of the cooling apparatus 100. In addition, the cyclic heating pipeline 1315 and the cyclic cooling pipeline 1316 that are integrated further reduce a quantity of components on the adsorption bed 131 and save internal space of the heat dissipation fin 1311, so that the heat dissipation fins 1311 can accommodate more adsorbents 1313, to achieve a better refrigeration effect.

Figure 13:
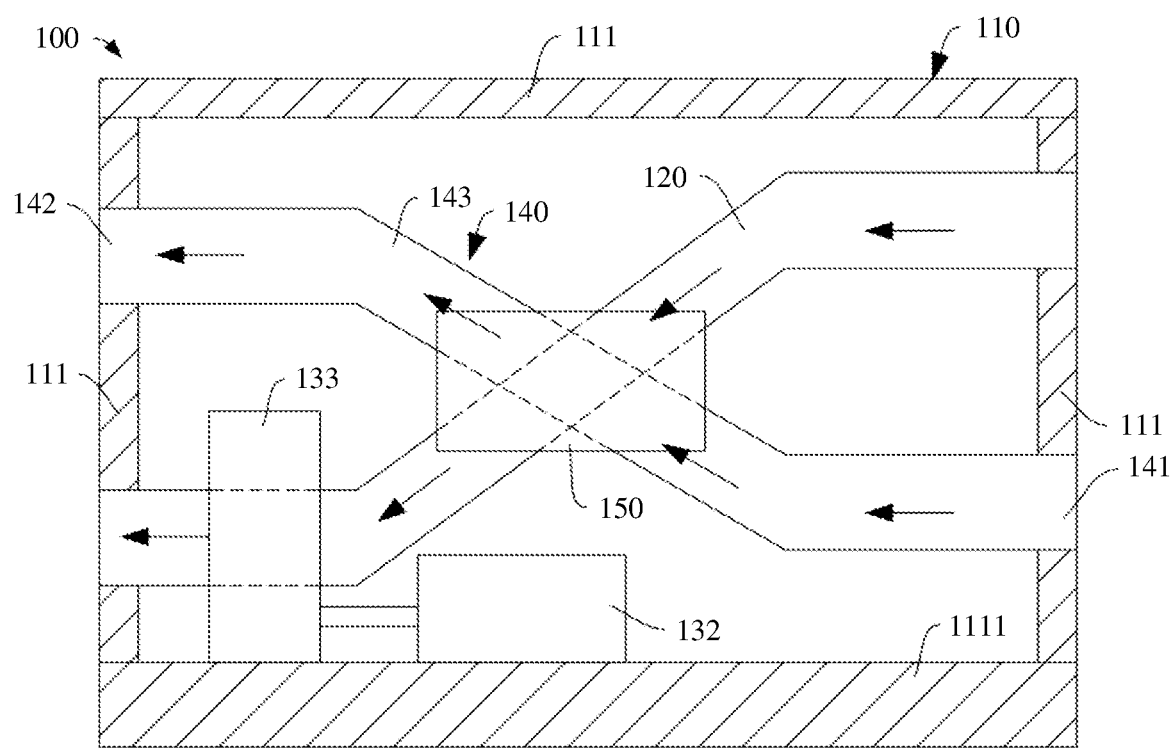
FIG. 13 is a schematic diagram of an internal structure of another cooling apparatus.

As shown in FIG. 13, the cooling apparatus 100 may include an external air duct 140 and a heat exchange unit 150. The external air duct 140 may include an air intake vent 141, an air exhaust vent 142, and an air duct 143. The air intake vent 141 and the air exhaust vent 142 are separately disposed on the sidewall 111 of the housing 110, and the air duct 143 is connected between the air intake vent 141 and the air exhaust vent 142. Further, the air intake vent 141 and the air exhaust vent 142 are further connected to the outside of the equipment room 200. The air intake vent 141 is configured to allow external air to enter the air duct 143, and the air exhaust vent 142 is configured to allow external air to flow out of the air duct 143.

Figure 14:
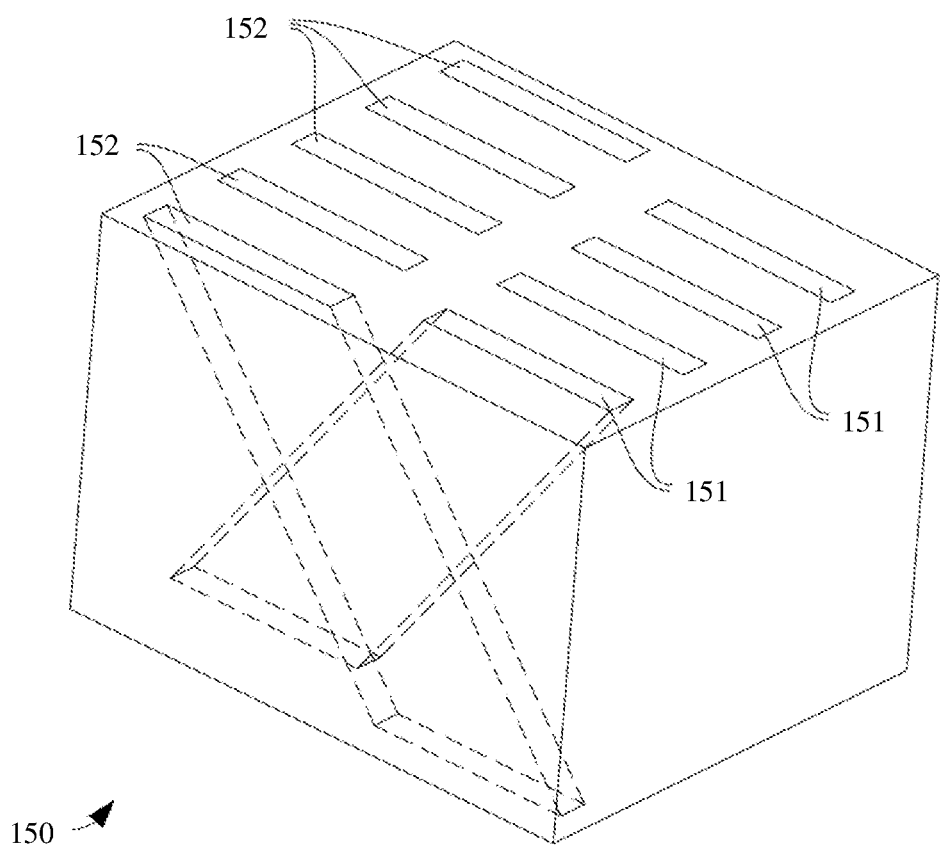
FIG. 14 is a schematic diagram of an internal structure of a heat dissipation unit in another cooling apparatus.

The air duct 143 is located in the inner cavity of the housing 110 and intersects the air duct 123 of the cooling air duct 120 in the inner cavity. The heat exchange unit 150 may be located in the inner cavity of the housing 110, and the heat exchange unit 150 may be further disposed at an intersection of the external air duct 140 and the cooling air duct 120. In other words, the air duct 143 and the air duct 123 intersect at a position of the heat exchange unit 150. As shown in FIG. 14, a plurality of mutually isolated air sub-ducts may be disposed at intervals in the heat exchange unit 150, and some air sub-ducts (defined as a first air sub-duct 151 in FIG. 14) are configured to connect to the air duct 123, or this is described as that the first air sub-duct 151 is constructed as a part of the air duct 123. Some other air sub-ducts (defined as a second air sub-duct 152 in FIG. 14) are configured to connect to the air duct 143, or this is described as that the second air sub-duct 152 is constructed as a part of the air duct 143.

Therefore, the first air sub-duct 151 and the second air sub-duct 152 are spaced apart, so that air in the equipment room 200 that is circulated in the air duct 123 may exchange heat with air outside the equipment room 200 that is circulated in the air duct 143. When temperature of the air outside the equipment room 200 is relatively low, a structure of the external air duct 140 and the heat exchange unit 150 can also cool and refrigerate the air in the equipment room 200. In other words, in the embodiment shown in FIG. 13, the adsorption refrigeration unit 130 and the heat exchange unit 150 may be separately or simultaneously used to cool and refrigerate the air in the equipment room 200. Disposing of the external air duct 140 and the heat exchange unit 150 further improves a refrigeration effect of the cooling apparatus 100.

Figure 15:
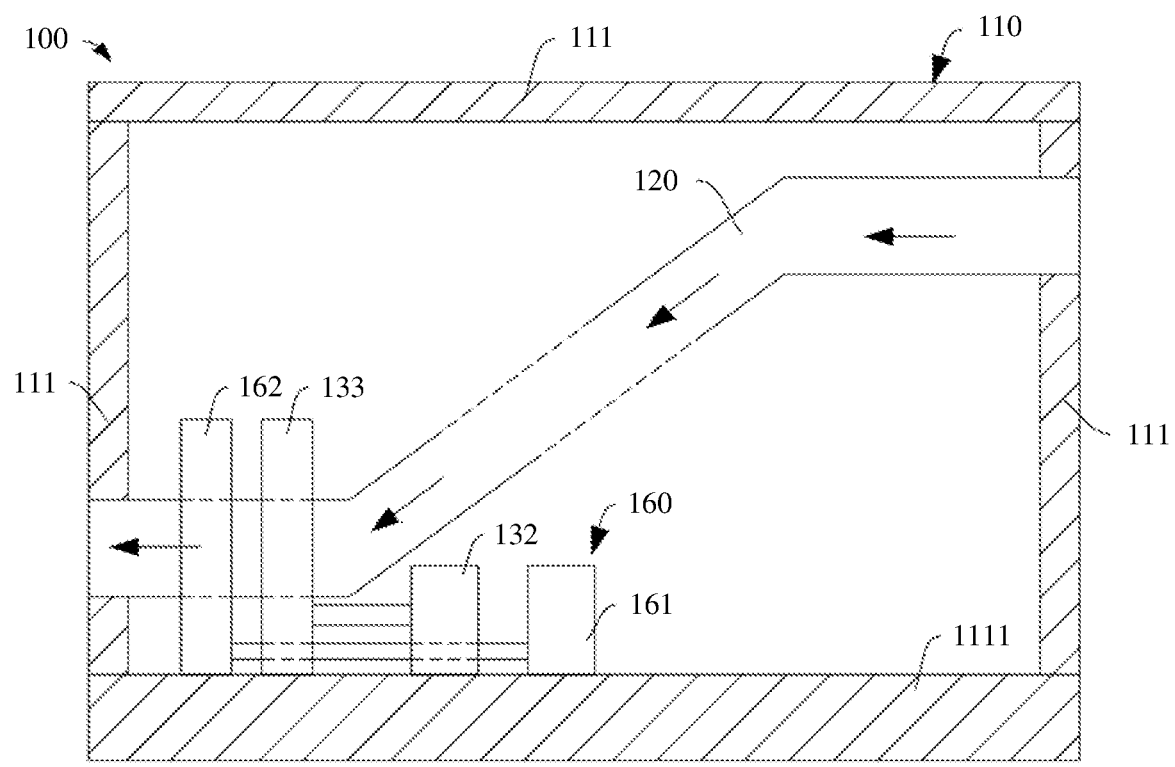
FIG. 15 is a schematic diagram of an internal structure of still another cooling apparatus.

As shown in FIG. 15, the cooling apparatus 100 may further include a mechanical refrigeration unit 160. The mechanical refrigeration unit 160 includes a compressor 161 and a condenser 162, and the condenser 162 is also disposed on the path of the cooling air duct 120. It may be understood that, through cooperation between the compressor 161 and the condenser 162, the condenser 162 disposed on the path of the cooling air duct 120 may form a refrigeration effect on the air in the equipment room 200. The cooling apparatus 100 can separately or simultaneously use the adsorption refrigeration unit 130 and the mechanical refrigeration unit 160 to form a cooling and refrigeration effect on the air in the equipment room 200. Disposing of the mechanical refrigeration unit 160 further improves the refrigeration effect of the cooling apparatus 100.

Figure 16:
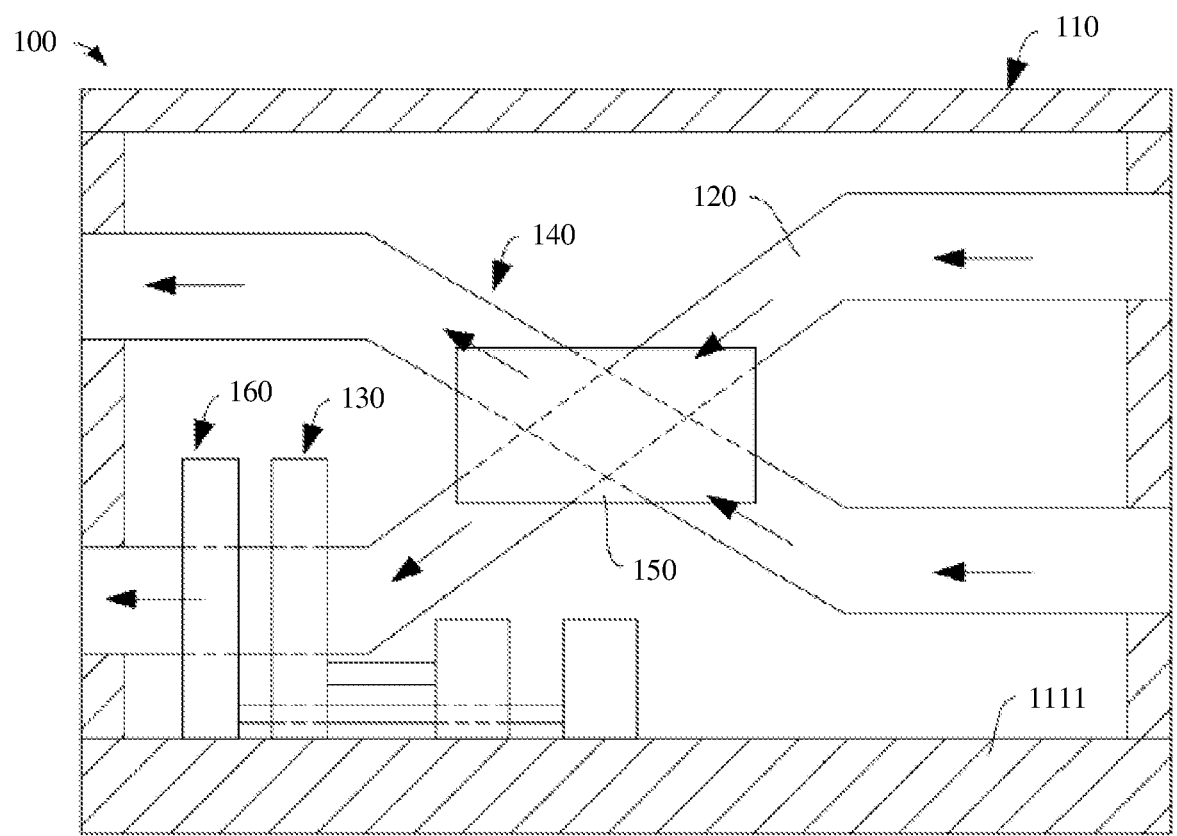
FIG. 16 is a schematic diagram of an internal structure of yet another cooling apparatus.

As shown in FIG. 16, an external air duct 140, a heat exchange unit 150, and a mechanical refrigeration unit 160 may all be disposed in the cooling apparatus 100. A position of the heat exchange unit 150 and a position of a condenser 162 are separated, and the cooling apparatus 100 can separately or simultaneously use the adsorption refrigeration unit 130, the heat exchange unit 150, and the mechanical refrigeration unit 160 to cool and refrigerate the air in the equipment room 200. Therefore, cooling components may be centrally scheduled, so that each refrigeration component works independently or cooperatively. In this way, a combination of different cooling components may be used based on real-time temperature of the air in the equipment room 200 to cool and refrigerate the air in the equipment room 200. In addition, because the foregoing cooling apparatus 100 is also used in the data center, the volume of the cooling apparatus 100 is effectively controlled, so that utilization of internal space of the data center is improved, an overall volume of the data center can be controlled, or more IT devices are deployed, and a data processing capability of the data center is improved.

The foregoing descriptions are merely embodiments but are not intended as limiting. Any change or replacement readily figured out by a person skilled in the art, such as reduction or addition of a structural component or change of a shape of a structural component, shall fall within the scope of the embodiments. In a case of no conflict, the embodiments and features in the embodiments may be mutually combined.

What is claimed is:

1. A cooling apparatus; comprising:
   a housing, wherein the housing comprises a plurality of sidewalls configured to form an inner cavity;
   a cooling air duct configured to pass through the inner cavity; and
   an adsorption refrigeration unit, that comprises an adsorption bed, a flash evaporator, and an air cooler, wherein the flash evaporator is connected to the air cooler, both the flash evaporator and the air cooler are disposed in the inner cavity, the air cooler is located on a path of the cooling air duct, at least one of the plurality of sidewalls is a refrigeration sidewall, the refrigeration sidewall comprises an internal wall plate and an external wall plate, the internal wall plate and the external wall plate are spaced apart and form a sealed space, the sealed space is connected to the flash evaporator, and the adsorption bed is disposed in the sealed space.

2. The cooling apparatus according to claim 1, wherein the adsorption bed further comprises;
   at least one heat dissipation fin; and
   a heat dissipation cavity, wherein a plurality of mesh holes penetrating the heat dissipation cavity are disposed on each heat dissipation fin, an adsorbent is accommodated in the heat dissipation cavity, the adsorbent is connected to the sealed space through the mesh holes, and the adsorbent is used to adsorb or desorb moisture in the sealed space.

3. The cooling apparatus according to claim 2, wherein the adsorption bed further comprises:
   a cyclic heating pipeline configured to pass through each heat dissipation fin, to heat the adsorbent.

4. The cooling apparatus according to claim 3, wherein the adsorption bed further comprises:
   a cyclic cooling pipeline configured to pass through each heat dissipation fin, to cool the adsorbent.

5. The cooling apparatus according to claim 4, wherein the cyclic heating pipeline and the cyclic cooling pipeline are constructed as an integrated structure.

6. The cooling apparatus according to claim 4, further comprising:
   an external air duct configured to pass through the inner cavity and intersect the cooling air duct in the inner cavity; and
   a heat exchange unit, disposed at an intersection of the external air duct and the cooling air duct, that is configured to implement a heat exchange between the external air duct and the cooling air duct.

7. The cooling apparatus according to claim 3, further comprising:
   an external air duct configured to pass through the inner cavity and intersect the cooling air duct in the inner cavity; and
   a heat exchange unit, disposed at an intersection of the external air duct and the cooling air duct, that is configured to implement a heat exchange between the external air duct and the cooling air duct.

8. The cooling apparatus according to claim 2, wherein all the heat dissipation fins are disposed in a direction perpendicular to the external wall plate, and the plurality of heat dissipation fins are sequentially arranged in a direction parallel to the external wall plate.

9. The cooling apparatus according to claim 2, further comprising:
   an external air duct configured to pass through the inner cavity and intersect the cooling air duct in the inner cavity; and
   a heat exchange unit, disposed at an intersection of the external air duct and the cooling air duct, that is configured to implement a heat exchange between the external air duct and the cooling air duct.

10. The cooling apparatus according to claim 1, wherein a solenoid valve is disposed between the sealed space and the flash evaporator, and the solenoid valve is configured to establish or disconnect the connection between the sealed space and the flash evaporator.

11. The cooling apparatus according to claim 1, wherein all the plurality of sidewalls of the housing are constructed as refrigeration sidewalls.

12. The cooling apparatus according to claim 1, further comprising:
   an external air duct configured to pass through the inner cavity and intersect the cooling air duct in the inner cavity; and
   a heat exchange unit, disposed at an intersection of the external air duct and the cooling air duct, that is configured to implement a heat exchange between the external air duct and the cooling air duct.

13. The cooling apparatus according to claim 1, further comprising:
   a mechanical refrigeration unit comprising a condenser disposed on the path of the cooling air duct.

14. A data center, comprising
an equipment room; and
a cooling apparatus, which comprises;
   a housing, wherein the housing comprises a plurality of sidewalls configured to form an inner cavity,
   a cooling air duct configured to pass through the inner cavity, and
   an adsorption refrigeration unit comprising an adsorption bed, a flash evaporator, and an air cooler, wherein the flash evaporator is connected to the air cooler, both the flash evaporator and the air cooler are disposed in the inner cavity, the air cooler is located on a path of the cooling air duct, at least one of the plurality of sidewalls is a refrigeration sidewall, the refrigeration sidewall comprises an internal wall plate and an external wall plate, the internal wall plate and the external wall plate are spaced apart and form a sealed space, the sealed space is connected to the flash evaporator, the adsorption bed is disposed in the sealed space, and opposite ends of a cooling air duct are separately connected to an inner side of the equipment room.

* * * * *